United States Patent
Ochi et al.

(10) Patent No.: US 10,403,990 B2
(45) Date of Patent: Sep. 3, 2019

(54) PRESS-FIT TERMINAL AND ELECTRONIC DEVICE

(71) Applicant: DENSO CORPORATION, Kariya, Aichi-pref. (JP)

(72) Inventors: Kenji Ochi, Kariya (JP); Takumi Shiomi, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/114,470

(22) Filed: Aug. 28, 2018

(65) Prior Publication Data
US 2019/0074613 A1  Mar. 7, 2019

(30) Foreign Application Priority Data
Sep. 4, 2017 (JP) .................. 2017-169809

(51) Int. Cl.
| | |
|---|---|
| H01R 12/00 | (2006.01) |
| H01R 12/58 | (2011.01) |
| H01R 43/16 | (2006.01) |
| H01R 13/03 | (2006.01) |

(52) U.S. Cl.
CPC .......... *H01R 12/585* (2013.01); *H01R 43/16* (2013.01); *H01R 13/03* (2013.01); *H05K 2201/1059* (2013.01)

(58) Field of Classification Search
CPC ...... H01R 12/585; H01R 13/03; H01R 43/16; H05K 2201/1059
USPC ....................................................... 439/82
See application file for complete search history.

(56) References Cited

U.S. PATENT DOCUMENTS

| | | | | |
|---|---|---|---|---|
| 2,870,424 A | * | 1/1959 | Franz .................. | H01R 13/11 439/252 |
| 3,803,537 A | * | 4/1974 | Cobaugh ............. | H01R 12/718 439/844 |
| 4,149,764 A | * | 4/1979 | Mattingly, Jr. ...... | H01R 12/523 439/284 |
| 4,606,589 A | * | 8/1986 | Elsbree, Jr. ......... | H01R 12/585 439/751 |

(Continued)

FOREIGN PATENT DOCUMENTS

| | | |
|---|---|---|
| JP | 2006-140042 A | 6/2006 |
| JP | 2008-251293 A | 10/2008 |

(Continued)

*Primary Examiner* — Abdullah A Riyami
*Assistant Examiner* — Vladimir Imas
(74) *Attorney, Agent, or Firm* — Posz Law Group, PLC

(57) ABSTRACT

A press-fit terminal is configured to exert a reaction force through elastic deformation on a through-hole and to be supported by the board, and includes two beams to be opposite to each other and to be elastically deformable. The two beams respectively have counter surfaces facing to each other. Each beam includes: a base material with a main surface and a side surface having one or more rounded corners formed in a curved surface with a contact zone in contact with the wall surface of the through-hole; and a plated film having a main portion on the main surface and an extension portion having an average thickness smaller than an average thickness of the main portion. The two beams have two or more of the rounded corners in total, and at least one of the rounded corners are provided with the extension portion.

8 Claims, 12 Drawing Sheets

(56) References Cited

U.S. PATENT DOCUMENTS

| | | | | | |
|---|---|---|---|---|---|
| 4,769,907 | A | * | 9/1988 | Sebastien | H01R 12/585 29/874 |
| 4,797,113 | A | * | 1/1989 | Lambert | H01R 9/096 439/295 |
| 4,878,861 | A | * | 11/1989 | Kendall | H01R 12/585 439/751 |
| 5,730,607 | A | * | 3/1998 | Darty | H01R 12/716 439/74 |
| 6,077,128 | A | * | 6/2000 | Maag | H01R 12/585 439/751 |
| 6,231,402 | B1 | * | 5/2001 | Kikuchi | H01R 12/585 439/751 |
| 6,276,945 | B1 | * | 8/2001 | Hayward | H01R 13/6588 439/82 |
| 6,443,743 | B1 | * | 9/2002 | Saran | H01L 23/5226 174/261 |
| 7,048,594 | B2 | * | 5/2006 | Tsuchiya | H01R 12/585 439/751 |
| 7,249,981 | B2 | * | 7/2007 | Chen | H01R 12/585 439/751 |
| 7,377,823 | B2 | * | 5/2008 | Chen | H01R 12/585 439/751 |
| 7,445,499 | B2 | * | 11/2008 | Nunokawa | H01R 12/585 439/567 |
| 7,491,897 | B2 | * | 2/2009 | Watanabe | H01R 12/585 174/266 |
| 7,780,483 | B1 | * | 8/2010 | Ravlich | H01R 12/585 439/751 |
| 7,891,992 | B2 | * | 2/2011 | Veigel | H01R 43/16 439/82 |
| 8,259,460 | B2 | * | 9/2012 | Bhattacharya | H05K 3/301 174/260 |
| 8,313,344 | B2 | * | 11/2012 | Johnescu | H01R 12/585 439/571 |
| 8,388,356 | B2 | * | 3/2013 | Nichols | H01R 12/7082 439/65 |
| 8,771,028 | B2 | * | 7/2014 | Tonosaki | H01R 13/03 439/151 |
| 9,093,780 | B2 | * | 7/2015 | Miyake | H01R 12/585 |
| 9,276,338 | B1 | * | 3/2016 | Dariavach | H01R 12/585 |
| 9,685,719 | B2 | * | 6/2017 | Uchida | H01R 12/585 |
| 9,692,156 | B2 | * | 6/2017 | Matsumoto | H01R 13/03 |
| 10,014,606 | B2 | * | 7/2018 | Yamanaka | H01R 12/7064 |
| 10,027,048 | B2 | * | 7/2018 | Ochi | H01R 13/03 |
| 10,109,936 | B2 | * | 10/2018 | Shiomi | H01R 12/585 |
| 2006/0089011 | A1 | * | 4/2006 | Marshall | H01R 12/73 439/65 |
| 2007/0010139 | A1 | * | 1/2007 | Chen | H01R 12/585 439/751 |
| 2008/0166928 | A1 | * | 7/2008 | Tang | H01R 12/585 439/751 |
| 2009/0233466 | A1 | * | 9/2009 | Lee | H05K 1/141 439/74 |
| 2013/0100628 | A1 | * | 4/2013 | Yamaguchi | H01R 12/585 361/792 |
| 2015/0259813 | A1 | | 9/2015 | Kodama et al. | |
| 2017/0077627 | A1 | * | 3/2017 | Matsumoto | H01R 13/03 |

FOREIGN PATENT DOCUMENTS

| | | |
|---|---|---|
| JP | 2010-262861 A | 11/2010 |
| JP | 2014-149956 A | 8/2014 |

* cited by examiner

PRESS-FIT TERMINAL AND ELECTRONIC DEVICE

CROSS REFERENCE TO RELATED APPLICATION

This application is based on Japanese Patent Application No. 2017-169809 filed on Sep. 4, 2017, the disclosure of which is incorporated herein by reference.

TECHNICAL FIELD

The present disclosure relates to a press-fit terminal and an electronic device including the press-fit terminal.

BACKGROUND

JP 2010-262861 A discloses a press-fit terminal inserted into a through-hole of a board. The press-fit terminal has a plated film on the surface of base material.

In a situation where the press-fit terminal has the plated film, it is possible to suppress the oxidation of a contact zone with a wall surface of the through-hole caused by air before the press-fit terminal has a contact with the wall surface of the through-hole. In addition, by having the plated film, it is also possible to lower a frictional coefficient and minimize press-fitting load.

The press-fit terminal is formed by punching a plate material or a bar material into a predetermined shape through press working. The side surface other than the front surface in a plate thickness shape is a portion punched by the press working. The side surface of the press-fit terminal makes a contact with the wall surface of the through-hole. Accordingly, it is required to provide the plated film at a contact zone between the side surface of the press-fit terminal and the wall surface of the through-hole.

A conventional press-fit terminal such as the one described in JP 2010-262861 A is formed by performing press working on the plate material and then performing plating on the plate material. Accordingly, the plated film is formed not only on the front surface but also on the side surface having a contact zone made between the press-fit terminal and the side wall surface of the through-hole. However, it results in a higher manufacturing cost for performing a plating process after punching the press-fit terminal into a predetermined shape.

SUMMARY

It is an object of the present disclosure to provide a press-fit terminal and an electronic device for suppressing oxidation before press fitting while minimizing press-fitting load with a lower manufacturing cost.

A press-fit terminal according to a first aspect of the present disclosure is configured to be inserted through a through-hole of a board in a first direction and configured to exert a reaction force through elastic deformation on a wall surface of the through-hole and to be supported by the board. The press-fit terminal includes two beams, and each of the two beams has a base material and a plated film. The two beams are configured to be opposite to each other and to be elastically deformable in a second direction perpendicular to the first direction. The two beams respectively have counter surfaces facing to each other in the second direction. The base material has a main surface and a side surface. The main surface faces a third direction, which is perpendicular to the first direction and the second direction. The side surface is connected to the main surface and that has a punching portion; and is opposite to the counter face; and includes one or more rounded corners, each of the rounded corners is formed in a curved surface with a contact zone to be in contact with the wall surface of the through-hole, at one or corresponding end portions of the side surface along the third direction. The plated film has a main portion and an extension portion. The main portion is at the main surface of the base material. The extension portion is extended from the main portion to the contact zone on the punching portion of the side surface; and has an average thickness, which is smaller than an average thickness of the main portion. Moreover, the two beams have two or more of the rounded corners in total, and at least one of the two or more of the rounded corners are provided with the extension portion.

With the plated film (or an extension portion) provided at the contact zone between the press-fit terminal and the wall surface of the through-hole, it is possible to suppress the oxidation of the contact zone between the press-fit terminal and the wall surface of the through-hole caused by air before the press-fit terminal makes a contact with the wall surface of the through-hole. In addition, with the plated film, it is possible to lower the frictional coefficient while minimizing the press-fitting load.

Moreover, the plated film refers to the so-called pre-plated film, which is formed before punching the base material from the plate material through press working. The extension portion of the press-fit terminal is formed with press working on the pre-plated film and extended to the top of punching portion. Thus, the extension portion is connected to the main portion of the press-fit terminal and is slimmer than the main portion.

Thus, the plated film is not the after-plated film, which is formed after the press working. Accordingly, it is possible to suppress oxidation before press fitting while reducing the press-fitting load with lower manufacturing cost.

An electronic device according to a second aspect of the present disclosures includes: a board having a through-hole; and a press-fit terminal configured to be inserted through a through-hole of a board in a first direction and to be supported by the board. The press-fit terminal includes two beams configured to be opposite to each other and configured to exert a reaction force through elastic deformation on a wall surface of the through-hole to be elastically deformable in a second direction perpendicular to the first direction. The two beams respectively have counter surfaces facing to each other in the second direction. Each of the two beams includes a base material and a plated film. The base material has: a main surface facing a third direction, which is perpendicular to the first direction and the second direction; and a side surface that is connected to the main surface and that has a punching portion, that is opposite to the counter surface, and that includes rounded corners, each is formed in a curved surface with a contact zone to be in contact with the wall surface of the through-hole, at corresponding two end portions of the side surface along the third direction. The plated film has: a main portion on the main surface of the base material; and an extension portion that is extended from the main portion to the contact zone on the punching portion of the side surface, and that has an average thickness, which is smaller than an average thickness of the main portion. Additionally, the two beams include four rounded corners in total. Moreover, a curvature radius of each of the four rounded corners is represented by r, and an inner diameter of the through-hole is represented by d. Furthermore, r/d is equal to or smaller than 0.25.

The electronic device described above exhibits the advantageous effect similar to the one generated in the above-mentioned press-fit terminal.

Since the curvature radius r of the rounded corner is smaller, a part of the side surface having the rounded corners is in contact with the wall surface of the through-hole, and the other part of the side surface located between the rounded corners is not in contact with the wall surface of the through-hole. Therefore, the extension portion of the plated film can be firmly in contact with the wall-surface of the through-hole. Accordingly, the connection reliability is further enhanced.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Figure 1:
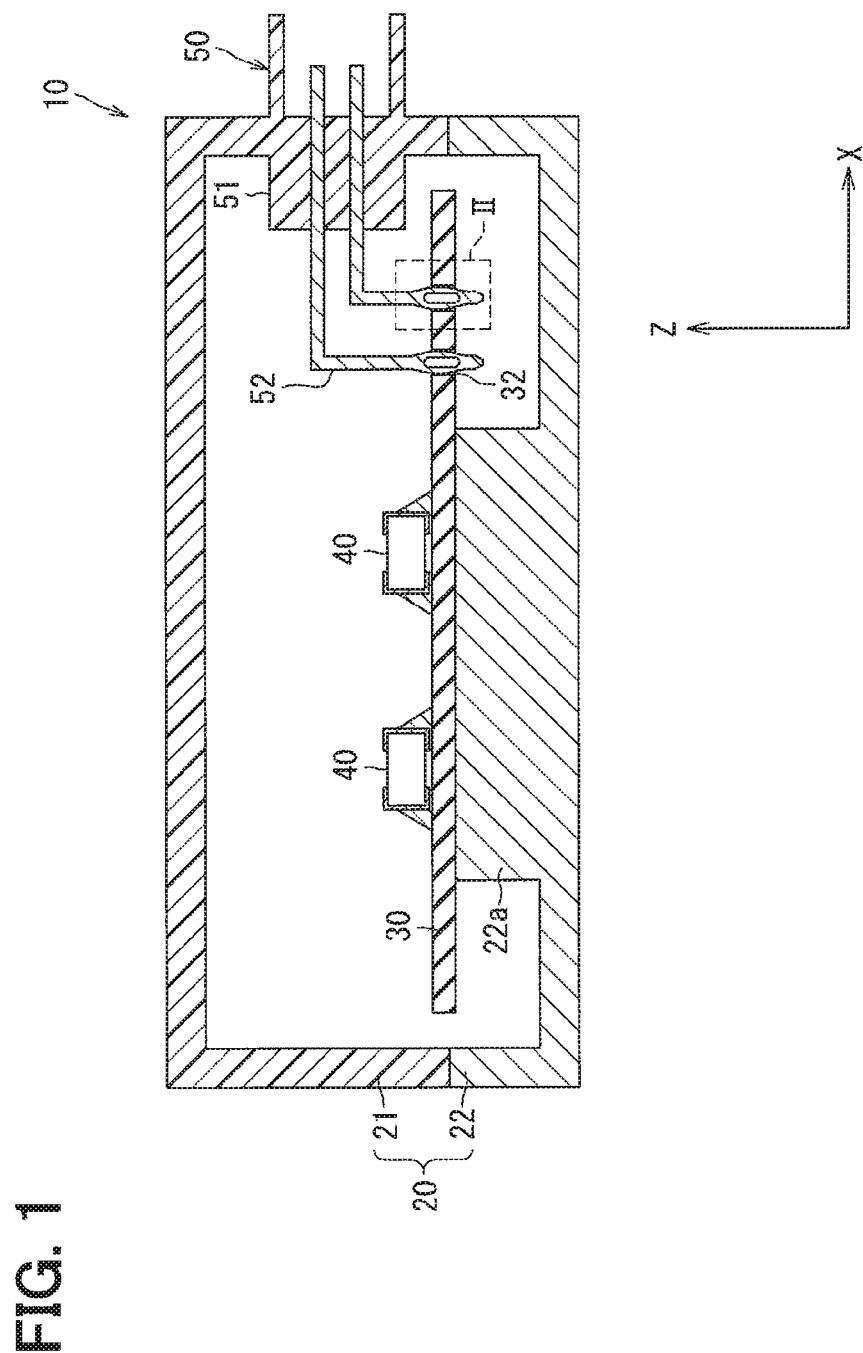
FIG. 1 is a cross sectional view illustrating a schematic configuration of an electronic device including a press-fit terminal according to a first embodiment.

A plurality of embodiments is described with reference to drawings. With regard to the plurality of embodiments, the same reference numerals are appended to corresponding functional parts and/or structural parts. In the following, a Z-direction (or a first direction) represents an inserting direction of a press-fit terminal to a through-hole, in other words, a board's thickness direction. In addition, the shape viewed in an XY plane, in other words, the shape along the XY plane can be represented as a planner shape. The XY plan view may also be called as a projecting view in the Z-direction.

First Embodiment

First of all, the following describes a generic configuration of an electronic device including a press-fit terminal according to a first embodiment.

An electronic device 10, which is illustrated in FIG. 1, is configured to, for example, control a vehicle. The electronic device 10 includes a housing 20, a board 30, an electronic component 40 and a connector 50.

The housing 20 stores the board 30 and the electronic component 40 inside the housing 20, and protects the board 30 and the electronic component 40. For instance, the housing 20 is made of a metal material such as aluminum for enhancing heat dissipation for heat generated by the electronic component 40. Other than that, the housing 20 may be made of resin material for reducing the load of the electronic device 10.

In the present embodiment, the housing 20 has two members divided in the Z-direction, in particular, has a case 21 and a cover 22. The case 21 is made of resin material, and the cover is made of aluminum material. The housing 20 is configured by assembling the case 21 and the cover 22 in the Z-direction. The method for assembling the case 21 and the cover 22 is not particularly limited. For example, a well-known method such as screw fastening may be used.

The case 21 is formed in a box shape having an opening at one surface. The bottom surface of the case 21 is substantially formed in a rectangular shape facing the board 30 formed substantially planner rectangular shape. The cover 22 and the case 21 are configured to form inner space of the housing 20.

Figure 2:
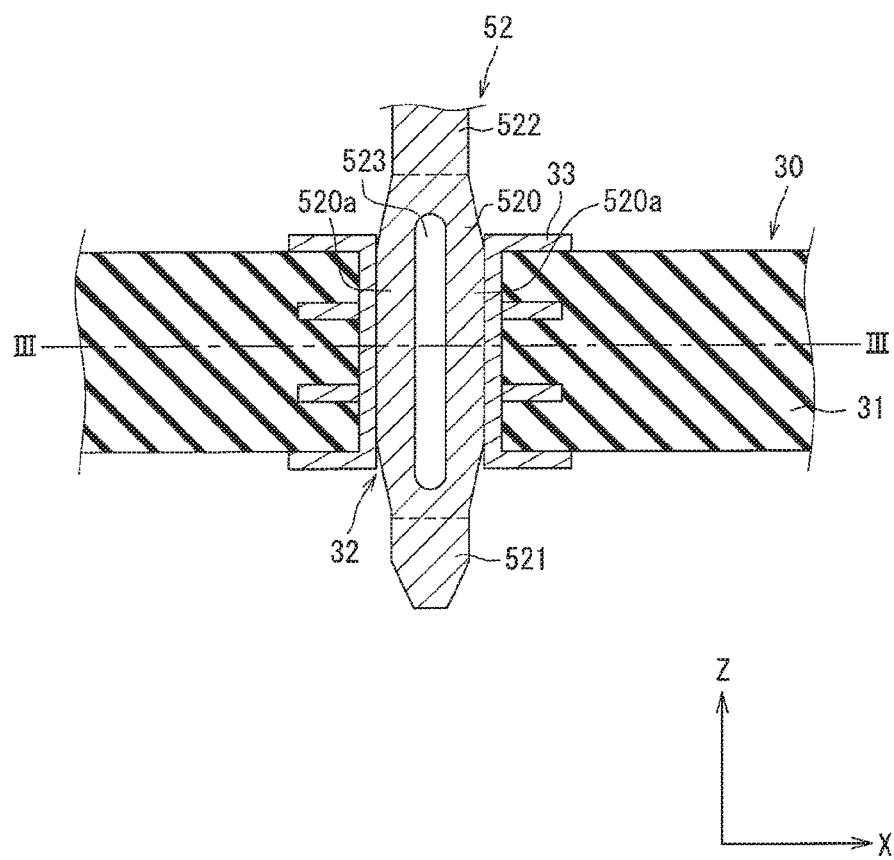
FIG. 2 is a cross sectional view illustrating a connection structure between the press-fit terminal and a board, and corresponds to a region II in FIG. 1.

The board 30 is the so-called printed circuit board. As shown in FIG. 2, the board is made of base material 31, which is formed with the use of electrical insulation material such as resin. The wiring is arranged on the base material 31. The wiring is not drawn in FIG. 1, and only a part of wiring is illustrated in FIG. 2.

The board 30 has a through-hole 32. The through-hole 32 penetrates the board 30 or the base material 31 in the Z-direction (or first direction) as the board's thickness direction. The through-hole 32 has a cross sectional shape (an opening shape) formed into a substantially circular shape. The through-hole 32 is a penetration hole with a predetermined diameter.

Plating is performed on the wall surface of the through-hole 32 and then a land 33 is formed. The wall surface of the through-hole 32 has the land 33. The land 33 may also be called the through-hole plating. The opening shape of the through-hole 32 having the land 33 is also formed in a substantially circular shape. The land 33 is formed together with the wall surface of the through-hole 32 and the surrounding of the opening of the through-hole 32. The aftermentioned press-fit terminal 52 of the connector 50 is welded to the land 33.

With regard to the main metal component for plating, at least one of, for example, Sn, Cu, Ni, Pd and Ag may be used. The land 33 in the present embodiment is formed with Cu plated film on the base material 31.

The board 30 is formed in a substantially planar rectangular shape. The board 30 is fixed to the housing 20 by a well-known fixing method such as screw fastening or adhesion. In the present embodiment, the cover 22 is formed in a box shape with a shallower depth. A convex portion 22a is formed at the inner surface located at the bottom part of the cover 22. The convex portion 22a is protruded toward the board 30. The board 30 is fixed to the housing 20 (or the cover 22) such that the board 30 is supported by the convex portion 22a.

The electronic component 40 is mounted to the board 30. The electronic component 40 is configured as wiring formed on the board 30 and a circuit. The board 30 on which the electronic component is mounted is a circuit board. The electronic component 40 is connected to the land (not shown) through, for example, solder. In the present embodiment, the rear surface of the board 30, which is opposite to the part where the electronic component 40 is mounted, is supported by the convex portion 22a. Accordingly, the heat generated by the electronic component 40 can be efficiently dissipated to the housing 20 or the cover 22 made of metal.

The connector 50 is arranged at one end side of the board 30 in the X-direction (or the second direction). The connector 50 has one portion exposed to outside through the housing 20, and the connector 50 has the remaining portion stored inside the housing 20. The connector 50 has a housing 51 and a plurality of terminals. The housing 51 is formed with using resin material. For example, in the present embodiment, the housing 51 is formed together with the case 21 made of resin. The plurality of terminals is held by the housing 51.

The terminal is formed with using conductive material, and is configured to make an electrical relay between the circuit, which is configured by the board 30 and the electronic component 40, and an external device. The plurality of terminals (not shown) is aligned along the Y-direction as the width direction of the housing 51. In the present embodiment, since the number of terminals is larger, the terminals are arranged in a stacking manner in the Z-direction. Each of the plurality of terminals is substantially formed in an L shape in a ZX plane. The present embodiment uses the press-fit terminal 52 as the terminal.

Figure 3:
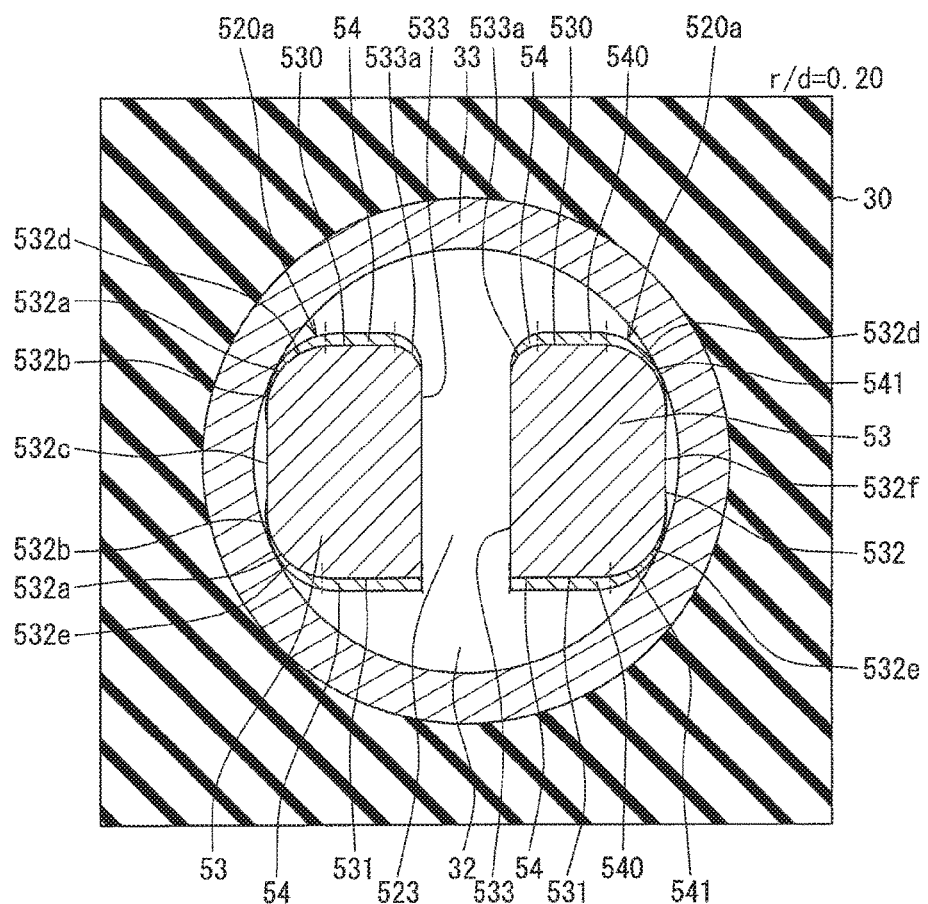
FIG. 3 is a cross sectional view along a III-III line in FIG. 2.

The press-fit terminal 52 is press-fitted into the through-hole 32 and is held by the board 30. As illustrated in FIG. 3, the press-fit terminal 52 includes: base material 53 formed by using metal material; and a plated film 54 for covering the base material 53. The base material 53 is formed by, for example, Cu or Cu alloy as the configuration material. The base material 53 is formed by punching a plate member 53a made of, for example, Cu or Cu alloy through press working.

At least one of, for example, Sn, Cu, and Ni is used as the main metallic component of the plated film 54. In the present embodiment, the plated film 54 having two layer structures is plated by Cu plating and Sn plating in order, and is formed on the base material 53. It is noted that Ni plating can be used instead of Cu plating. The detail of the base material 53 and the plated film 54 is described hereinafter.

The press-fit terminal 52 includes an elastic portion 520, an introductory portion 521 and a rear end portion 522. The elastic portion 520 has elasticity in a direction, which is perpendicular to the inserting direction to the through-hole 32 (that is, Z-direction or the first direction). At least one part of the elastic portion 520 is arranged at the through-hole 32, and exerts a reaction force through elastic deformation on the wall surface of the through-hole 32 (or the land 33).

The press-fit terminal 52 is formed in the so-called eye of needle shape. The press-fit terminal 52 also includes an opening portion (or a hollow space) 523, which is formed to arrange at least one part of the press-fit terminal 52 is arranged inside the through-hole 32 when the press-fit terminal 52 is connected to the board 30. The opening portion 523 is a penetration hole that penetrates the board 30, and that faces the Y-direction (or a third direction). The opening portion 523 is extended in the Z-direction (or the first direction), that is, in the length direction of the press-fit terminal 52. The extended length of the opening portion 523 is not particularly limited. The extended length may be set to be longer than the length of the through-hole 32, or it may be set to be shorter than or equal to the length of the through-hole 32.

The press-fit terminal 52 is diverted into two beams 520a by the opening portion 523. The beam's thickness direction is in the Y-direction (or the third direction). In the X-direction perpendicular to the beam's thickness direction, the longest length between the outer front surfaces of two beams 520a is set to be longer than the inner diameter of the through-hole 32 when the press-fit terminal 52 is not inserted into the through-hole 32 (that is, prior to the insertion state). The length between the respective outer surfaces of two beams 520a along the X-direction becomes longer gradually from the rear end portion 522 towards the introductory portion 521, and then becomes shorter as approaching to the introductory portion 521. It is noted that the beam 520a corresponds to a beam portion.

The elastic portion 520 is configured by having two beams 520a. The elastic portion 520 is a portion that surrounds the opening portion 523, and is deformable when it is inserted to the through-hole 32. A broken line illustrated in FIG. 2 represents a boundary line between the elastic portion and each of the introductory portion 521 and the rear end portion 522.

The introductory portion 521 is a tip of the press-fit terminal 52 provided at one end of the elastic portion 520 that is firstly to be inserted into the through-hole 32. The introductory portion 521 is connected to one end of the elastic portion 520. The length of the introductory portion 521, which is the longest portion between the outer front surfaces is set to be shorter than, for example, the inner diameter of the through-hole 32. The introductory portion 521 is a portion for guiding the press-fit terminal 52 inside the through-hole 32. The introductory portion 521 may also called a front end portion. The rear end portion 522 is a tip portion, which is opposite to the introductory portion 521 with respect the elastic portion 520. The rear end portion 522 is connected to another end of the elastic portion 520.

Figure 4:
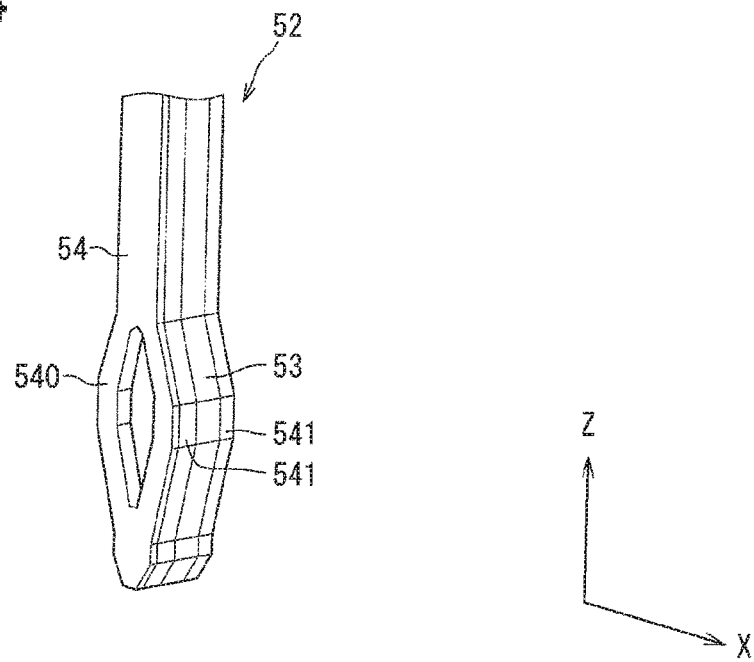
FIG. 4 is a perspective view that illustrates the press-fit terminal.

The following describes a detailed configuration of the base material 53 and the plated film 54 included in the press-fit terminal 52 with reference to FIGS. 3 and 4.

As illustrated in FIG. 3, the base material 53 includes a first surface in the beam's thickness direction and a second surface connected to the first surface. The base material 53 has a front surface 530 and a rear surface 531, which is opposite to the front surface 530, each of which being the first surface. The base material 53 has a side surface (or the second surface) 532 and an opposite surface 533, both of which being connected surfaces. In FIG. 3, a broken line illustrates a boundary formed between a surface (such as the front surface 530 and the rear surface 531) and the connected surface (such as the side surface 532 and the opposite surface 533).

The front surface 530 and rear surface 531 are substantially in parallel with reference to ZX plane. That is, the front surface 530 and the rear surface 531 are substantially perpendicular to the beam's thickness direction as the Y-direction. The front surface 530 and the rear surface 531 are the surfaces derived from the after-mentioned plate's surfaces 530a and 531a.

The side surface 532 is extended to both of the front surface 530 and the rear surface 531. The side surface 532 is a surface connected to the front surface 530 and the rear surface 531. With regard to the beam 520a, the side surface 532 is an outer side surface, which is opposite to the surface at the opening portion 523 side, as the surface linked to the front surface 530 and the rear surface 531. Accordingly, each of the two beams 520a has the side surface 532. The side surface 532 includes at least a punching portion to be punched by the press working (shearing). The punching portion may be also called, for example, the punching surface, cutting surface, or cut end. The punching portion includes a shear drop 532a, a shear surface 532b and a break surface 532c.

The shear drop 532a has a curved surface. The shear drop 532a is provided at two ends of the punching portion in the Y-direction. The shear surface 532b is adjacent to the shear drop 532a, and the break surface 532c is adjacent to the shear surface 532b. That is, in a direction from the front surface 530 to the rear surface 531, the shear drop 532a, the shear surface 532b, the break surface 532c, the shear surface 532b and the shear drop 532a are arranged in order. The break surface 532c is provided around the center of the side surface 532 along the Y-direction, and the shear surface 532b of the side surface 532 is provided to sandwich the break surface 532c.

Each of the side surfaces 532 has rounded corners 532d, 532e formed in a curved surface at both ends of the side surface 532 in the Y-direction. The rounded corner 532d is arranged at the end portion of the side surface 532 at the front surface 530 side, and the rounded corner 532e is provided at the end portion of the side surface 532 at the rear surface 531 side. Accordingly, the two beams 520a have four rounded corners in total. The rounded corners 532d, 532e are directly in contact with the wall surface of the through-hole 32, or the rounded corners 532d, 532e are in contact with the wall surface of the through-hole 32 through the plated film 54. In this embodiment, each of the four rounded corners is in contact with the wall surface of the through-hole 32 through the plated film 54. In particular, one part of each of the rounded corners 532d, 532e is in contact with the wall surface of the through-hole 32 through the plated film 54. Each of the rounded corners 532d, 532e includes a contact zone, which is in contact with the wall surface of the through-hole 32.

Each of the rounded corners 532d and 532e at least includes a punching portion. In addition, each of the rounded corners 532d and 532e at least includes the shear drop 532a. Each of the rounded corners 532d, 532e may also include at least one portion of the shear surface 532b in addition to the shear drop 532a. The contact zone made between the wall surface of the through-hole and the rounded corner 532d or 532e includes at least one of the shear drop 532a and the shear surface 532b, which are included in the punching portion. The break surface 532c is included in a portion connecting the rounded corners 532d and 532e, which are respectively located at the end of the side surface 532.

In the present embodiment, one part of the after-mentioned plate surfaces 530a and 531a is processed so as to form a curved surface by coining working subsequent to press working, and then to be included in the rounded corners 532d and 532e. The part of the rounded corner 532d or 532e having a contact with the wall surface of the through-hole 32 through the plated film 54 is configured as the above-mentioned punching portion. In addition, the four rounded corners 532d and 532e are configured to have substantially identical curvature radius.

In particular, the curvature radius of each of the four rounded corners 532d and 532e is represented by r, and the inner diameter d of the through-hole 32 where the land 33 is arranged is represented by d. The rounded corners 532d and 532e are processed to satisfy the relation $r/d=0.2$ in the present embodiment. Since the curvature radius r is smaller than the inner diameter d, as illustrated in FIG. 3, the side surface 532 has a substantially flat portion between the rounded corners 532d and 532e. When the press-fit terminal 52 is inserted into the through-hole 32, the four rounded corners 532d and 532e are in contact with the wall surface of the through-hole 32.

The respective opposite surfaces 533, which are located at the two beams 520a aligned in the X-direction, are mutually opposed to each other. The opposite surface 533 forms the wall surface of the above-mentioned opening portion 523. The opposite surface 533 is a surface, which is linked to the front surface 530 and the rear surface 531, as the inner surface facing the opening portion 523. The opposite surface 533 has the rounded corner 533a formed in a curved surface at the end portion, which is viewed in the Y-direction, at the front surface 530 side. The rounded corner 533a is configured by the punching portion formed by the press working. The opposite surface 533 is not processed by the coining process. Therefore, the curvature radius of the rounded corner 532d or 532e is set to be larger than the curvature radius of the rounded corner 533a. The opening portion 523 is formed by press working from the front surface side as described in the following. The rounded corner 533a is not provided at the end portion of the opposite surface 533 located at the rear surface 531 side.

As described hereinafter, the plated film 54 originates from a pre-plated film 54a processed before punching the base material 53 by the plate member 53a through press working. The plated film 54 has a main portion 540 and an extension portion 541. The main portion 540 is provided on the front surface of the base material 53, that is, on the front surface 530 and the rear surface 531. The main portion 540 covers the whole surface of the front surface 530, and covers the whole surface of the rear surface 531. The film thickness of the main portion 540 is made to be substantially uniform on the front surface 530 and on the rear surface 531.

The extension portion 541 is extended from the main portion 540 and provided on the punching portion at the side surface 532. The extension portion 541 is provided at the contact zone, which is in contact with the through-hole 32. The portion extended form the main portion 540 for covering the contact zone is the extension portion 541. The extension portion 541 is linked together with the main portion 540. The extension portion 541 covers a contact zone, which is in contact with the wall surface located at each of the four rounded corners 532d and 532e.

The extension portion 541, as described hereinafter, at least includes a portion elongated to the punching portion side after the pre-plated film 54a, which is provided on the plate surfaces 530a, 531a, is processed by press working. Since the extension portion 541 is forcibly to be extended from the main portion by press working, the average film thickness of the extension portion 541 is slimmer than the thickness of the main portion 540. The average film thickness of the extension portion 541 at the rounded corner 532d side and the average film thickness of the extension portion 541 at the rounded corner 532e side are configured to be substantially identical. The extension portion 541 covers the whole area of the shear drop 532a and at least one part of the shear surface 532b.

In the present embodiment, one part of the respective plate surfaces 530a and 531a is included in the rounded corners 532d and 532e after carrying out punching through the coining process. Thus, one part of the plated film 54 on the plate surfaces 530a and 531a is included in the extension portion 541 after punching. The extension portion 541, as illustrated in FIGS. 3 and 4, covers the whole are of each of the rounded corners 532d and 532e, and also covers one part of the side surface 532 connecting the rounded corners 532d and 532e. The portion of the side surface 532 between two ends covered by the extension portion is exposed from the plated film 54. The side surface 532 includes an exposure portion 532f as not being covered by the plated film 54. The exposure portion 532f includes at least the break surface 532c.

The plated film 54 covers one part of the opposite surface 533. In particular, the one formation of the opposite surface 533 having the rounded corner 533a is covered by the plated film 54. The remaining part of the opposite surface 533 is exposed from the plated film 54.

Figure 5:
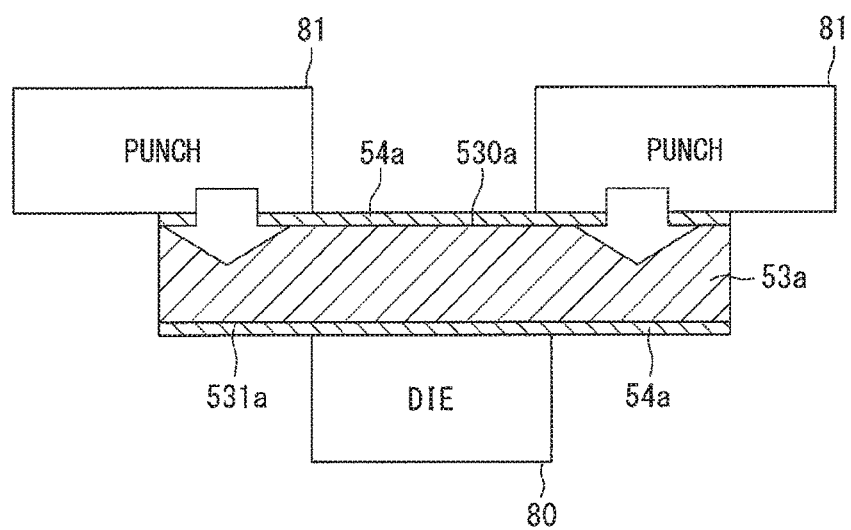
FIG. 5 is a schematic drawing that illustrates a method for manufacturing the press-fit terminal.
Figure 6:
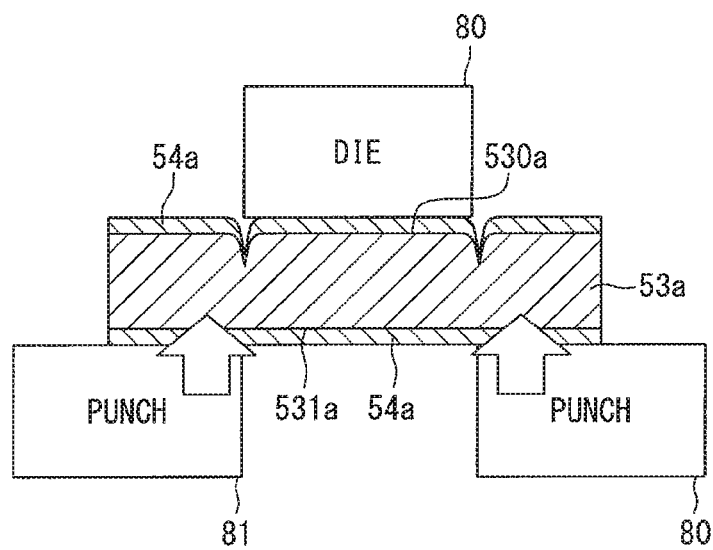
FIG. 6 is a schematic drawing that illustrates a method for manufacturing the press-fit terminal.
Figure 7:
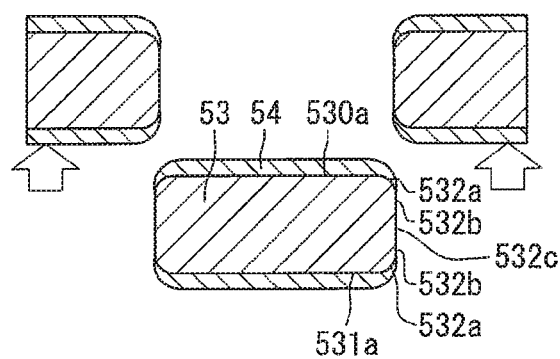
FIG. 7 is a schematic drawing that illustrates a method for manufacturing the press-fit terminal.

The following describes a method for manufacturing the press-fit terminal 52 with reference to FIGS. 5 to 7. FIGS. 5 to 7 illustrate the method schematically. The white arrows illustrated in FIGS. 5 to 7 respectively represent the pressing direction.

As illustrated in FIG. 5, a plate member 53a, on which the pre-plated film 54a is formed at the plate surfaces 530a, 531a of the plate member 53a as the surfaces viewed in the plate's thickness direction, is prepared. The plate member 53a is also called a section bar.

Next, a pressing process is carried out. First, the punching is carried out at the plate surface 530a side. In a situation where a die 80 supports the plate surface 531a at the punching portion of the plate member 53a having the pre-plated film 54a, a punch 81 is placed on the plate surface 530a for having a predetermined clearance from the die 80 in a plan view. Subsequently, the punch 81 is moved to a predetermined depth towards the plate surface 531a side, and then the plate member 53a is punched halfway through. For example, the plate member 53a is punched until the thickness of the plate member 53a is made to be a half of the original thickness. During the punching process, one part of the pre-plated film 54a on the plate surface 530a is dragged and then is extended towards the punching surface side as illustrated in FIG. 6.

Subsequently, a punching process is performed at the plate surface 531 side. In a situation where the die 80 supports the punching portion of the plate member 53a at the plate surface 530a side, the punch 81 is arranged on the plate surface 531a to have a predetermined clearance. Then, the punch 81 is moved towards the plate surface 530a side, and the remaining part of the plate member 53a is punched.

The base material 53, which is punched by the above-mentioned process, has the plated film 54 on the plate surfaces 530a and 531a. The base material 53 has a punching surface, which is linked to the plate surfaces 530a and 531a. The punching surface corresponds to the above-mentioned punching portion. The punching surface has the shear drop 532a, shear surface 532b, break surface 532c, shear surface 532b and shear drop 532a in order in a direction from the plate surface 530a to the plate surface 531a.

During the punching process carried out at the plate surface 531a side, one part of the pre-plated film 54a on the plate surface 531a is dragged and extended towards the punching surface side. Accordingly, the base material 53 has the plated film 54 at both ends of the punching surface.

Next, although it is not shown in the drawings, the opening portion 523 is formed at the base material 53 by the pressing process. In the present embodiment, the opening portion 523 as a penetration hole is formed by punching carried out at the plate surface 530a side. Thus, the base material 53 has two beams 520a. It is noted that the opening portion 523 may also be formed before punching the base material 53 by the plate member 53a.

The above-mentioned press-fit terminal 52 is attained through, for example, the coining process subsequent to the pressing process. In the coining process, the shape of a portion, which corresponds to four corners of the press-fit terminal 52, is refined and then the rounded corners 532d, 532e are formed.

The following describes the effects exhibited by the press-fit terminal 52 and the electronic device 10.

The press-fit terminal 52 in the present embodiment provides the extension portion 541 of the plated film 54 at the contact zone formed between the base material 53 and the wall surface of the through-hole 32. Accordingly, the contact zone formed between the base material 53 and the wall surface of the through-hole 32 can suppress the oxidation caused by gas before pressing the press-fit terminal 52 into the through-hole 32.

In addition, the plated film 54 exists at the contact zone formed between the base material 53 and the wall surface of the through-hole 32. Accordingly, the frictional coefficient is made to be smaller so as to reduce the press-fitting load.

The plated film 54 originates from the pre-plated film 54a previously formed before punching the base material 53 by the plate member 53a through the pressing process. The extension portion 541 covers the contact zone formed between the base material 53 and the wall surface of the through-hole 32. The extension portion 541 is formed by extending the pre-plated film 54a to the top of the punching portion during the pressing process. Thus, the extension portion 541 is linked to the main portion 540, and the average thickness of the extension portion 541 is made to be slimmer than the thickness of the main portion 540.

Therefore, the plated film 54 is not the after plated film, which is formed after the pressing process. The extension portion 541 also originates from the pre-plated film 54a. Since the pre-plating may be processed one time at the plate member 53a, it is possible to process the plating at higher speed compared to the after-plating for performing plating on the base material 53 having a predetermined shape. Accordingly, the plating cost can be lowered.

According to the press-fit terminal 52 described in the present embodiment, the oxidation can be suppressed before press-fitting while reducing the press-fitting load with lower manufacturing cost.

In the present embodiment, the four rounded corners 532d and 532e are configured to be in contact with the wall surface of the through-hole 32. The extension portion 541 is provided on all of the four rounded corners 532d and 532e. Accordingly, with regard to the all portions in contact with the wall surface, it is possible to suppress oxidation before press-fitting. In addition, it is possible to reduce the press-fitting load equally on all of the four rounded corners 532d and 532e. Accordingly, it is possible to suppress, for example, compression buckling at the time of inserting the press-fit terminal 52 into the through-hole 32. Accordingly, it is possible to enhance the mechanical connection reliability and electrical connection reliability between the press-fit terminal 52 and the board 30.

In the present embodiment, the side surface 532 includes the exposure portion 532f. The central portion of the side surface 532 viewed in the Y-direction is exposed from the plated film 54. Accordingly, it is possible to achieve the above-mentioned effects while reducing the dragging amount of the pre-plated film 54a towards the punching portion or the punching surface side. Thus, it is possible to make the pre-plated film 54a to be slimmer. Based on the above description, it is possible to further reduce the plating cost.

The rounded corners 532d and 532e are provided to meet the relation r/d=0.2 in the present embodiment. Accordingly, with regard to the two beams 520a, the four locations related to the rounded corners 532d and 532e are in contact with the through-hole 32. However, the portion between the rounded corners 532d and 532e is not in contact with the wall surface. Therefore, it is possible to achieve the above-mentioned effects.

Figure 8:
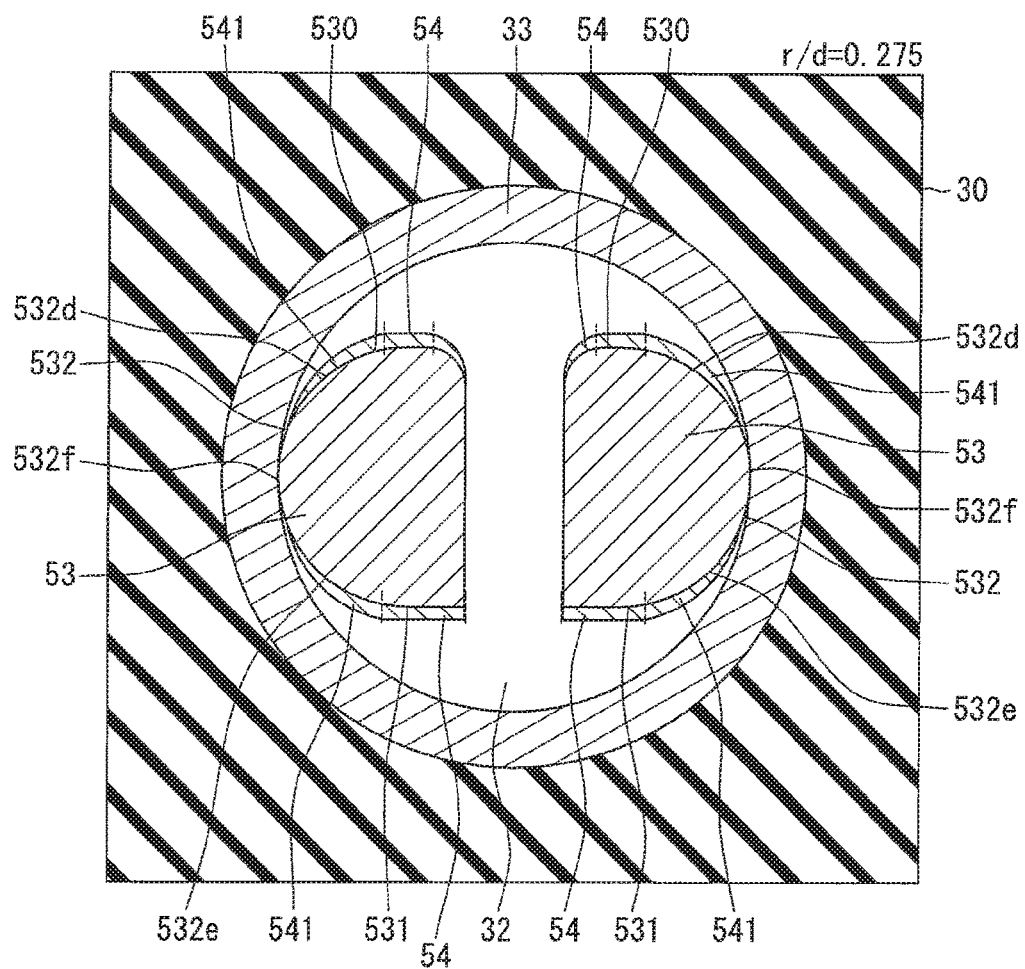
FIG. 8 is a drawing that illustrates a reference example, and corresponds to FIG. 3.

It is noted that both of the rounded corners 532d and 532e are not necessarily to be configured to satisfy the relation r/d=0.2. However, when the value of the relation r/d is larger, the rounded corners 532d and 532e approach to the contact zone formed between the beam 520a and the wall surface. For example, in a reference drawing illustrated in FIG. 8, if the relation r/d=0.275, the two rounded corners 532d and 532e are linked together at the beam 520a and forms one arc. Thus, the rounded corners 532d and 532e are in contact with the wall surface of the through-hole 32 at the center of the side surface 532. Accordingly, when the whole region of the side surface 532 does not cover the extension portion 541, the base material 53 is in contact with the wall surface of the through-hole 32. In order to cover the whole region of the side surface 532, it is required to drag the pre-plated film 54a from the punching portion side when the pressing process is carried out.

Figure 9:
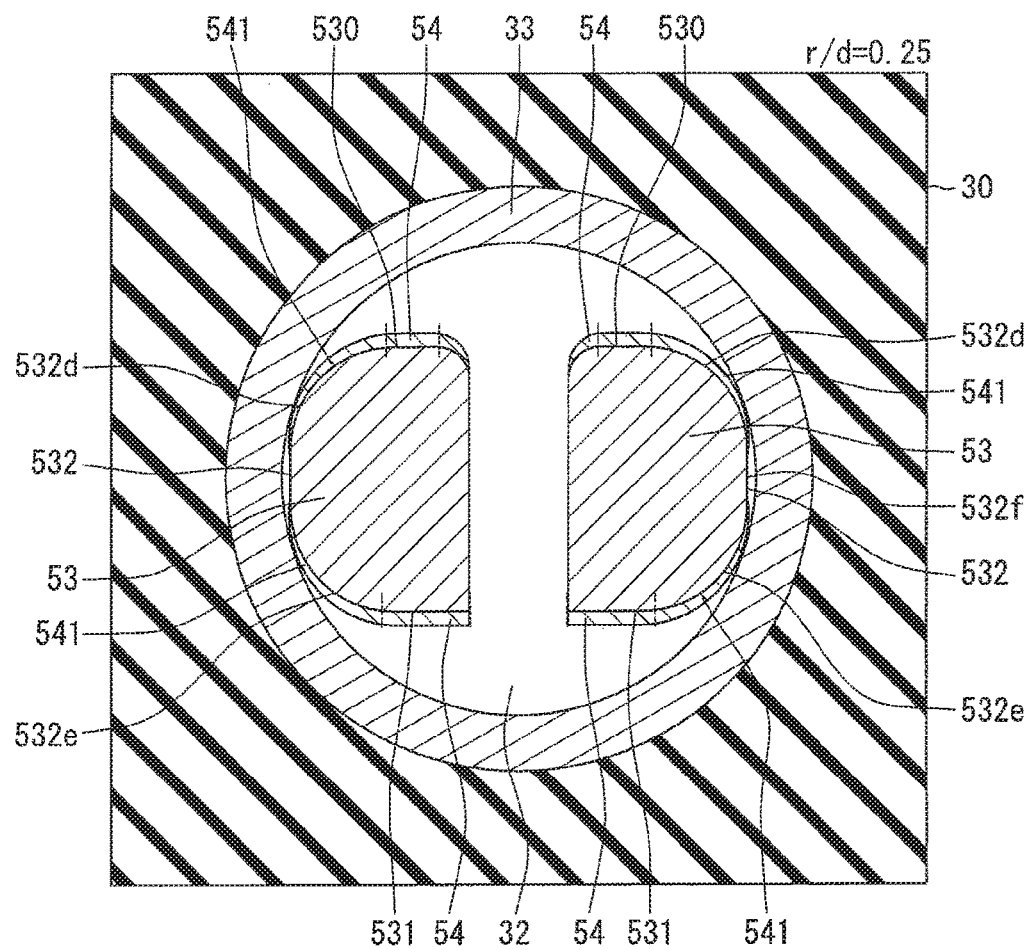
FIG. 9 is a drawing that illustrates a modified example, and corresponds to FIG. 3.
Figure 9:
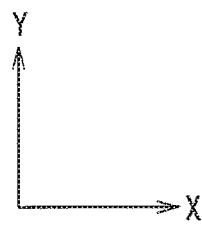

The modified example in FIG. 9 illustrates the relation r/d=0.25. In this situation, as similar to the above-mentioned embodiment, with regard to each of the two beams 520a for configuring the elastic portion 520, the rounded corners 532d and 532e at the beam 520a deviates in the Y-direction, and the rounded corners 532d and 532e are in contact with the wall surface.

According to the above description, the press-fit terminal 52 can be used as long as satisfying the relation r/d≤0.25. Thus, the rounded corners 532d and 532e are in contact with the wall surface. Accordingly, the extension portion 541 is easier to be in contact with the wall surface. In addition, a required amount of plating is reduced even when the extension portion 541 is in contact with the wall surface.

The above example illustrates that the opening portion 523 is formed by carrying out punching from the front surface 530. However, the opening portion 523 may be formed by carrying out punching from the rear surface 531 (plate surface 531a).

Second Embodiment

A second embodiment may be referred to the preceding embodiment. Therefore, the common parts related to the electronic device 10 and the press-fit terminal 52 illustrated in the preceding embodiment are not described in the following.

As illustrated in the first embodiment, all of the four rounded corners 532d and 532e are covered by the extension portion 541. In this situation, the break surface 532c is formed around the center of the side surface 532 for carry out punching from both of the plate surfaces 530a and 531a sides. The break surface 532c is rougher than the shear drop 532a and the shear surface 532b, therefore, it is considered that the plating is easily to be peeled off when the break surface 532c is in contact with the wall surface.

Figure 10:
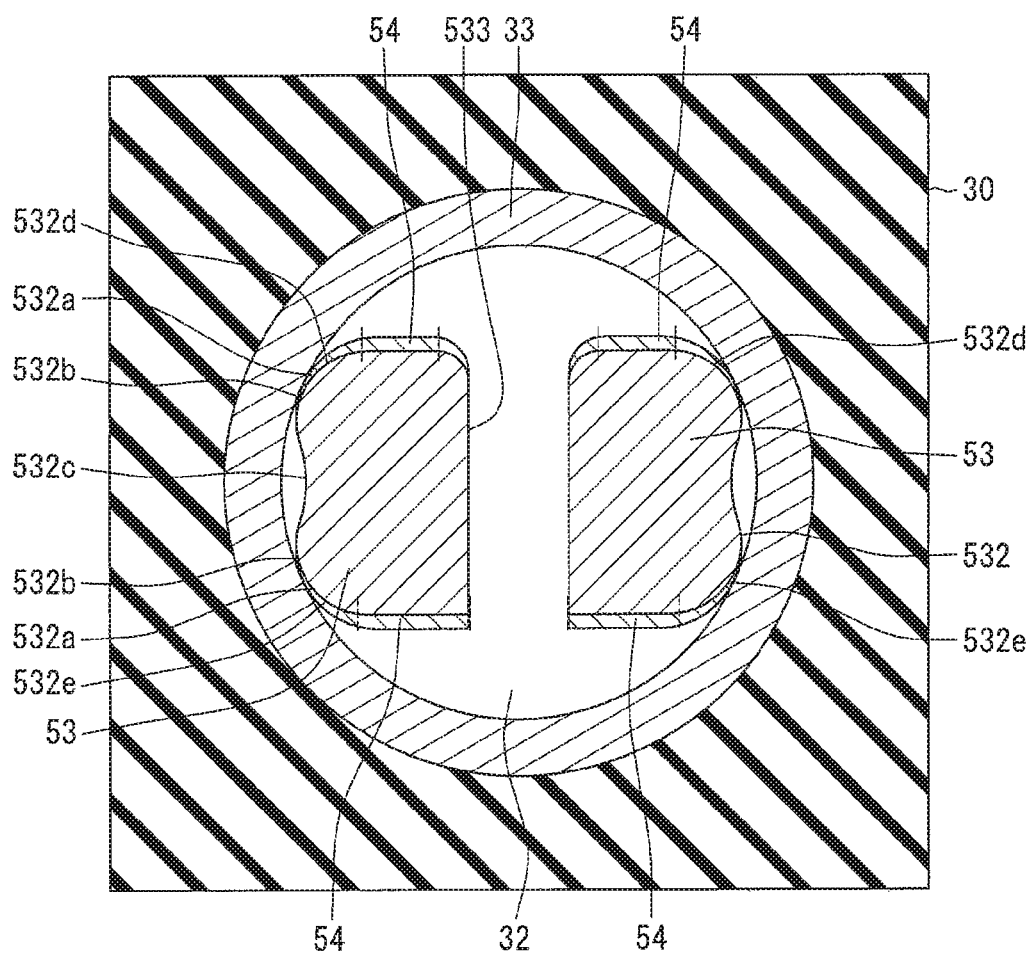
FIG. 10 is a cross sectional view that illustrates a press-fit terminal according to a second embodiment, and corresponds to FIG. 3.

In the second embodiment, as illustrated in FIG. 10, the break surface 532c is recessed towards the opposite surface 533 with respect to the shear surface 532b. In other words, the portion around the center of the side surface 532 is formed in a recessed (concave) part. The recessed part has a predetermined length in the Z-direction. The recessed part is provided in, for example, a portion of the beam 520a where is inserted into the through-hole 32. The configuration, other than the recessed part, is similar to the one described in the first embodiment. In other words, all of the four rounded corners 532d and 532e are covered by the extension portion 541. The recessed shape can be formed by the coining process.

According to the present embodiment, since the break surface 532c is made to be in a recessed shape, it can be firmly avoided that the break surface 532c is in contact with the land 33. Therefore, it is possible to suppress peeling off the land 33.

Since the portion around the center of the side surface 532 is hard to be in contact with the wall surface, the rounded corners 532d, 532e can be made in contact with the wall surface of the through-hole 32 firmly. Hence, the connection reliability is further enhanced.

Third Embodiment

The third embodiment may be referred to the preceding embodiments. Therefore, the common parts related to the electronic device 10 and the press-fit terminal 52 illustrated in the preceding embodiment are not described in the following.

Figure 11:
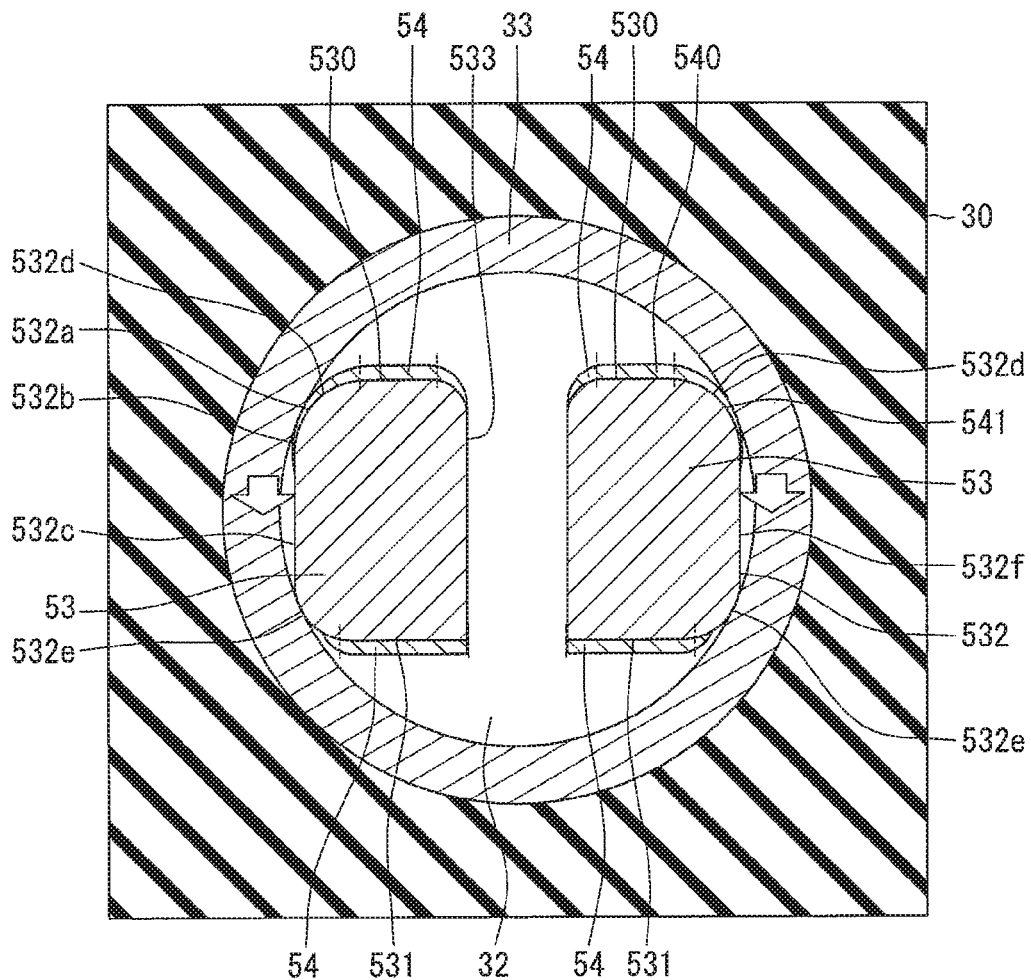
FIG. 11 is a cross sectional view that illustrates a press-fit terminal according to a third embodiment, and corresponds to FIG. 3.
Figure 12:
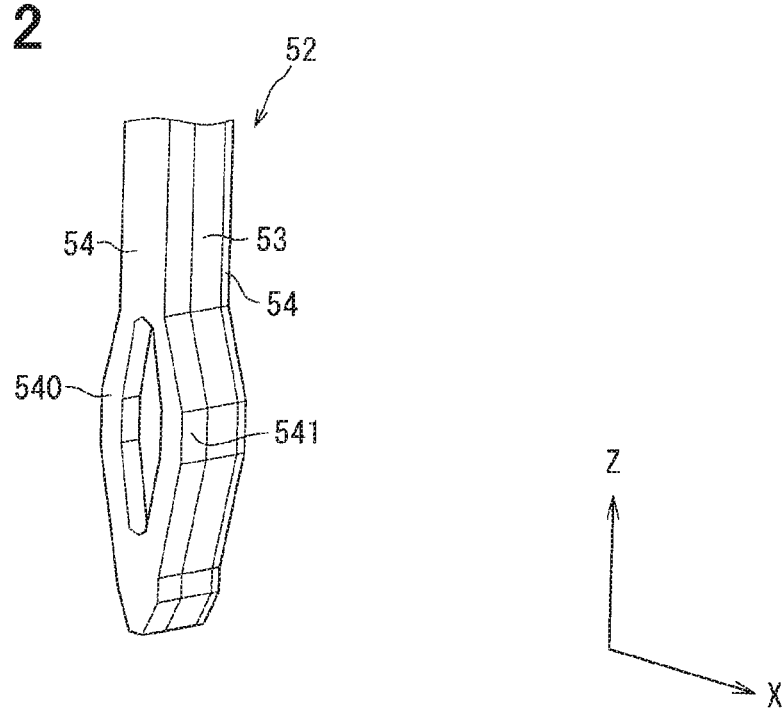
FIG. 12 is a perspective view that illustrates the press-fit terminal, and corresponds to FIG. 4.

In the present embodiment, the extension portion 541 is arranged only at two of the four rounded corners 532d and 532e located at the front surface side. Respective examples illustrated in FIGS. 11 and 12 illustrate that the extension portion 541 is arranged only at two rounded corners 532d located at the front surface 530 side, and the extension portion 541 is not arranged at the rounded corners located at the rear surface 531 side. The side surface 532 of the two beams 520a is formed by punching from the front surface 530 side. In other words, with regard to the formation of the side surface 532, it is not required to carry out punching from the rear surface 531 side as described in the first embodiment.

The rounded corner 532e is formed by the coining process. Since one portion of the plate surface 531a forms the rounded corners 532e by the coining process, the plated film 54 is arranged on the end portion of the rounded corner 532e at the rear surface 531 side. However, the plated film 54 is not arranged at the contact zone formed between the rounded corner 532e and the wall surface of the through-hole 32. In other words, the extension portion 541 covering the contact zone with the wall surface is not arranged at the rounded corner 532e. The side surface 532 includes the exposure portion 532f. Other than that, the configuration is similar to the one described in the first embodiment.

According to the present embodiment, the two rounded corners 532d provided with the extension portion 541 is arranged at a distantly position in the X-direction as elastic deformation direction. Thus, comparing with the configuration in which the extension portion 541 is provided only at one of the four rounded corners 532d and 532e, the balance is taken at the time of insertion with the two beams 520a. Accordingly, the connection reliability can be further enhanced.

The side surface 532 of the two beams 520a is formed by punching carried out from the front surface 530 side.

Accordingly, reducing the number of punching for simplifying the pressing process can be achieved. The white arrow illustrated in FIG. 11 shows the punching direction on each of the respective side surfaces 532.

The extension portion 541 is arranged only at the two rounded corners 532e at the rear surface 531 side, and is not arranged at the rounded corner 532d at the front surface 530 side. However, the above-mentioned effect can also be achieved.

Fourth Embodiment

A fourth embodiment can be referred to the preceding embodiments. Therefore, the common parts related to the electronic device 10 and the press-fit terminal 52 illustrated in the preceding embodiment are not described in the following.

The third embodiment illustrates that the extension portion 541 is provided at the two rounded corners 532d at the front surface 530 side and is not provided at the two rounded corners 532e at the rear surface 531 side. In this configuration related to the third embodiment, the contact zone formed between the rounded corner 532e and the wall surface is configured by the break surface 532c. The rounded corner 532d at the front surface 530 side has a smaller friction coefficient by having the extension portion 541 of the plated film 54. On the other hands, the rounded corner 532e at the rear surface 531 side does not have the extension portion 541 and the break surface 532c is exposed. Therefore, the rounded corner 532e has a friction coefficient larger than the friction coefficient of the rounded corner 532d. It is considered that the buckling occurs in the board's thickness direction since the difference between the friction coefficient at the front surface 530 side and the friction coefficient at the rear surface 531 side is larger.

Figure 13:
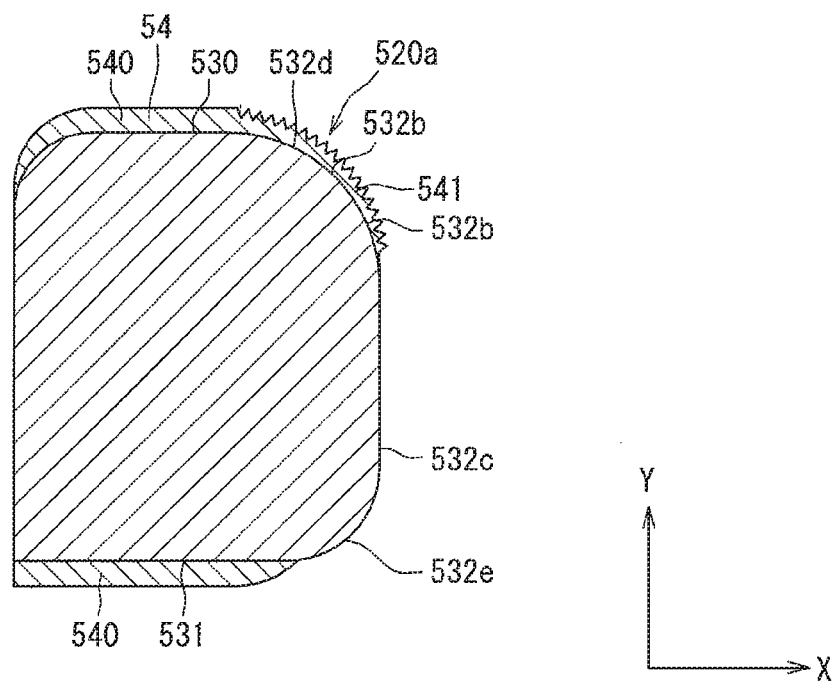
FIG. 13 is a cross sectional view that illustrates a press-fit terminal according to a fourth embodiment.

The surface of the extension portion 541 is roughened as illustrated in FIG. 13 in the fourth embodiment as the present embodiment. FIG. 13 is a cross sectional view of the press-fit terminal 52 corresponding to FIG. 11 that illustrates only one beam 520a. The extension portion 541 is roughened by, for example, a blasting process after the formation of the rounded corner 532d. The arithmetic average roughness of the rounded corner 532e refers to a portion where the portion exposed from the plated film 54 including the contact zone with the wall surface. Other than that, the configuration is similar to the one described in the third embodiment.

According to the present embodiment, the surface of the extension portion 541 provided at the rounded corner 532d is roughened. In contrast to the configuration which is not roughened, the friction coefficient at the rounded corner 532d (the front surface 530) side becomes larger so that the difference of the friction coefficient at the front surface 530 side and the friction coefficient at the rounded corner 532e (the rear surface 531) side becomes smaller. Therefore, the buckling can be suppressed.

Although FIG. 13 illustrates an example where the whole area of the extension portion is roughened, the contact zone with the wall surface of the through-hole 32 may also be roughened. The whole plated film 54 with the extension portion may also be roughened. It can be applicable to the configuration where the extension portion 541 is provided only at the two rounded corners 532e located at the rear surface 531 side.

Fifth Embodiment

A fifth embodiment can be referred to the preceding embodiments. Therefore, the common parts related to the electronic device 10 and the press-fit terminal 52 illustrated in the preceding embodiment are not described in the following.

Figure 14:
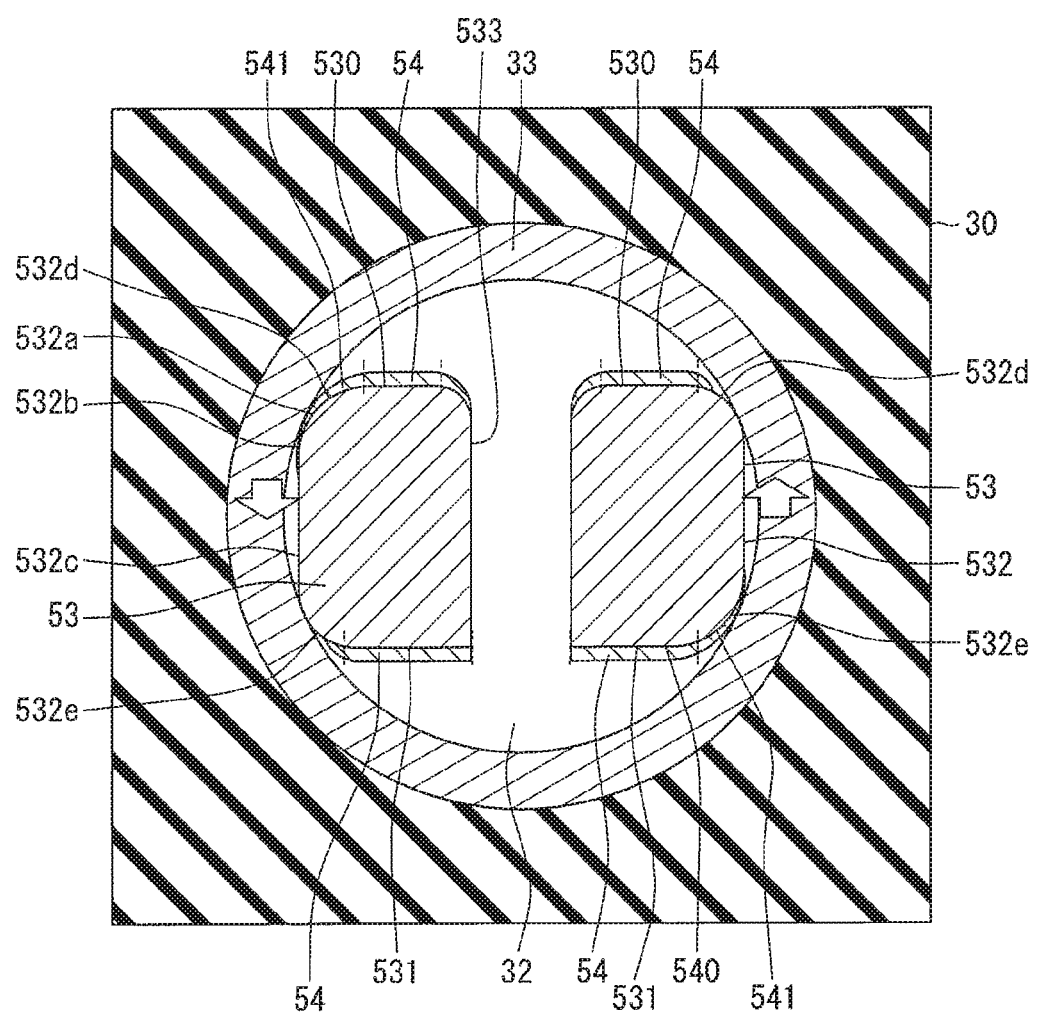
FIG. 14 is a cross sectional view that illustrates a press-fit terminal according to a fifth embodiment, and corresponds to FIG. 3.

In the present embodiment, as shown in FIG. 14, the extension portion 541 is provided only at a first rounded corner as one of the two rounded corners 532d at the front surface 530 side and at a second rounded corner, which is located at a diagonal position of the first rounded corner, as the rounded corner 532e at the rear surface 531 side. The extension portion 541 is not provided at the remaining two rounded corners 532d and 532e. The side surface 532 includes the exposure portion 532f.

The white arrow illustrated in FIG. 14 indicates the punching direction to the respective side surfaces 532. The side surface 532 at the rounded corner 532d (the first rounded corner) provided with the extension portion 541 is formed by punching from the front surface 530 side. The side surface 532 at the rounded corner 532e (the second rounded corner) provided with the extension portion 541 is formed by punching from the rear surface 531 side. The two rounded corners 532d and 532e without having the extension portion 541 is formed by the coining process. Other than that, the configuration is similar to the one described in the third embodiment.

According to the present embodiment, the two rounded corners 532d and 532e provided with the extension portion 541 is provided at a distantly position in the X-direction in the elastic deformation direction. In contrast to the configuration where the extension portion 541 is provided at only one of the four rounded corners 532d and 532e, the balance can be taken at the time of insertion with the two beams 520a. Accordingly, the connection reliability can be further enhanced.

Since the extension portion 541 is provided at the two rounded corners 532d and 532e, which form diagonal positions to each other, the friction coefficient at the front surface 530 side and the friction coefficient at the rear surface 531 side are substantially identical. Accordingly, it is possible to provide the extension portion 541 only at the two rounded corners 532d and 532e while suppressing the occurrence of buckling.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

The present application illustrates that the press-fit terminal 52 is a terminal of the connector 50. However, it is not particularly restricted to this case. For example, the terminal may be configured such that it can be inserted into the through-hole 32 of the board 30.

The press-fit terminal 52 having two beams has an eye of needle shape. However, it is not particularly restricted to this case. For example, it may also be formed in a bow-tie shape. Furthermore, it may also be formed in other shapes.

The present application illustrates that the extension portion 541 is provided at all of the four rounded corners 532d and 532e or at two of the four rounded corners 532d and 532e. However, it is not particularly restricted to the above cases. For example, the extension portion 541 can also be provided at one or more of the four rounded corners 532d and 532e.

Figure 15:
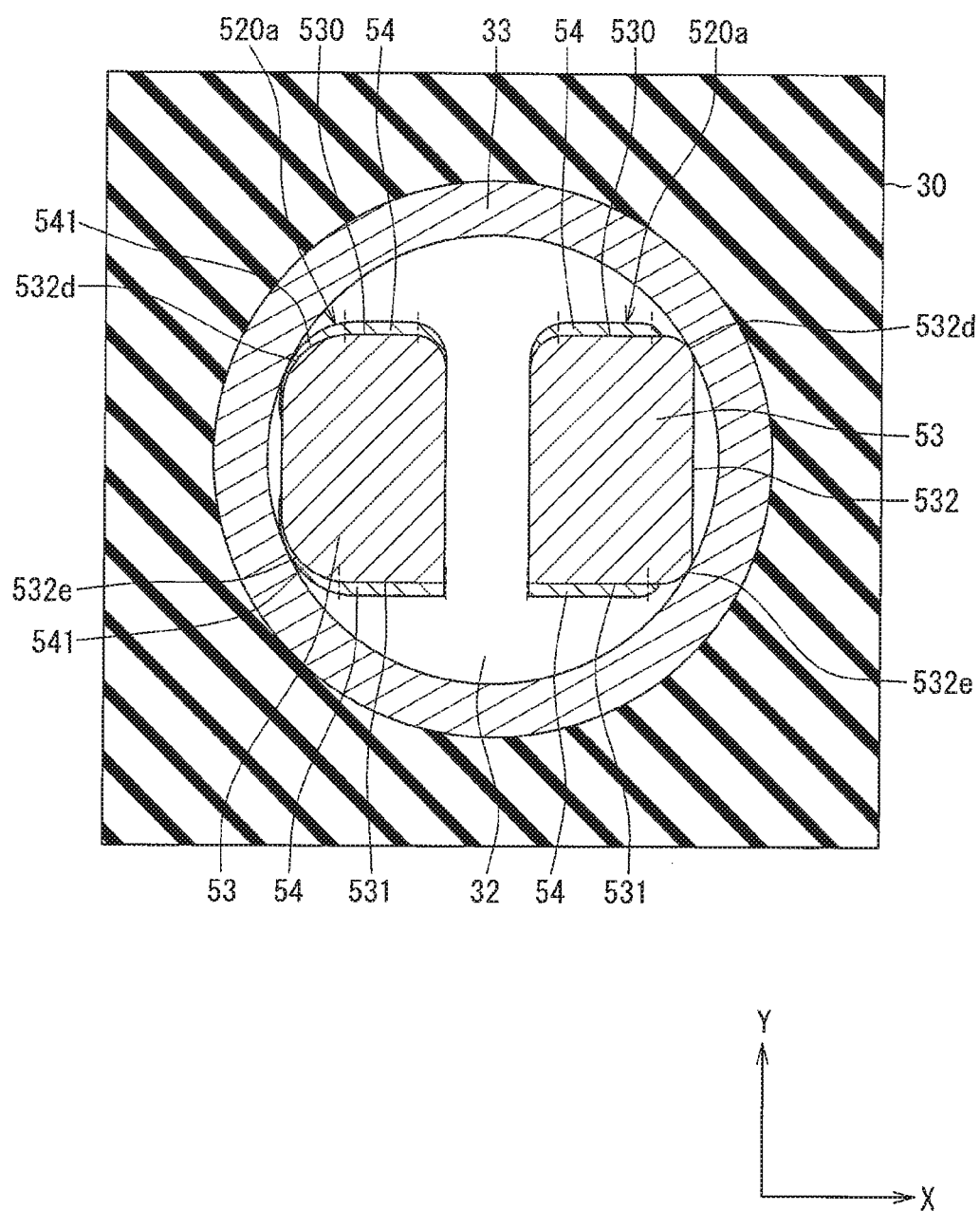
FIG. 15 illustrates another modified example, and corresponds to FIG. 3.

As illustrated in FIG. 15, with regard to the two beams 520a, the extension portion 541 may be provided only at one of the rounded corners 532d and 532e. With regard to an individual beam 520a, it is similar to the condition in which whether the extension portion 541 is provided or not. Thus, with regard to the individual beam 520a, the difference between the friction coefficient at the front surface 530 and the friction coefficient at the rear surface 531 can be reduced.

The present application illustrates an example in which the side surface 532 has an exposure portion 532f. However, it is not particularly restricted to this case. For example, the substantially whole region of the side surface 532 can be covered by the extension portion 541.

What is claimed is:

1. A press-fit terminal configured to be inserted through a through-hole of a board in a first direction and configured to exert a reaction force through elastic deformation on a wall surface of the through-hole and to be supported by the board, the press-fit terminal comprising:
    two beams configured to be opposite to each other and to be elastically deformable in a second direction perpendicular to the first direction, the two beams respectively having counter surfaces facing to each other in the second direction, each of the two beams including
    a base material that has:
        a main surface facing a third direction, which is perpendicular to the first direction and the second direction; and
        a side surface
            that is connected to the main surface and that has a punching portion,
            that is opposite to the counter face, and
            that includes one or more rounded corners, each of which is formed in a curved surface with a contact zone to be in contact with the wall surface of the through-hole, at one or corresponding end portions of the side surface along the third direction, and
    a plated film that has:
        a main portion on the main surface; and
        an extension portion
            that is extended from the main portion to the contact zone on the punching portion of the side surface, and
            that has an average thickness, which is smaller than an average thickness of the main portion,
    wherein the two beams have two or more of the rounded corners in total, and
    wherein at least one of the two or more of the rounded corners are provided with the extension portion.

2. The press-fit terminal according to claim 1, wherein the two beams include four rounded corners in total.

3. The press-fit terminal according to claim 2, wherein the side surface has:
    a break surface
        that is configured as the punching portion, and
        that is at a central portion of the side surface along the third direction; and
    a shear surface
        that is configured as the punching portion, and
        that is at each of both sides of the break surface along the third direction, and
    wherein the break surface is recessed towards the counter surfaces with respect to the shear surface.

4. The press-fit terminal according to claim 2,
    wherein each beam has two rounded corners, each rounded corner provided with the extension portion, and
    wherein a part of the side surface, which is between the respective extension portions at the two rounded corners, is exposed from the plated film.

5. The press-fit terminal according to claim 2,
    wherein the main surface includes a front surface and a rear surface, which is opposite to the front surface along the third direction,
    wherein the extension portion is only arranged at each one of two of the four rounded corners at a same side adjacent to the front surface or adjacent to the rear surface, and
    wherein a part of the side surface is exposed from the plated film.

6. The press-fit terminal according to claim 5,
    wherein an arithmetic average roughness of the extension portion is larger than an arithmetic average roughness of the rounded corners where the extension portion is not provided.

7. The press-fit terminal according to claim 2,
    wherein the main surface of the base material includes a front surface and a rear surface, which is opposite to the front surface along the third direction,
    wherein the four rounded corners have
        a first rounded corner as one of two rounded corners at a side with respect to the front surface, and
        a second rounded corner as one of remaining two rounded corners at a side with respect to the rear surface, the second rounded corner at a diagonal position of the first rounded corner,
    wherein the extension portion is only arranged at each one of the first rounded corner and the second rounded corner, and
    wherein a part of the side surface is exposed from the plated film.

8. An electronic device comprising:
    a board having a through-hole; and
    a press-fit terminal configured to be inserted through a through-hole of a board in a first direction and to be supported by the board, the press-fit terminal including
        two beams configured to be opposite to each other and configured to exert a reaction force through elastic deformation on a wall surface of the through-hole to be elastically deformable in a second direction perpendicular to the first direction, the two beams respectively having counter surfaces facing to each other in the second direction, each of the two beams including
            a base material that has:
                a main surface facing a third direction, which is perpendicular to the first direction and the second direction; and
                a side surface
                    that is connected to the main surface and that has a punching portion,
                    that is opposite to the counter surface, and
                    that includes rounded corners, each is formed in a curved surface with a contact zone to be in contact with the wall surface of the through-hole, at corresponding two end portions of the side surface along the third direction, and
            a plated film that has:
                a main portion on the main surface; and
                an extension portion that is extended from the main portion to the contact zone on the punching portion of the side surface, and that has an average thickness, which is smaller than an average thickness of the main portion, wherein the two beams include four rounded corners in total, wherein a curvature radius of each of the four rounded corners is represented by r, wherein an inner diameter of the through-hole is represented by d, and wherein r/d is equal to or smaller than 0.25.

* * * * *